United States Patent [19]

Abe et al.

[11] Patent Number: 4,952,528

[45] Date of Patent: Aug. 28, 1990

[54] PHOTOLITHOGRAPHIC METHOD FOR MANUFACTURING SEMICONDUCTOR WIRING PATTERNS

[75] Inventors: Masahiro Abe, Yokohama; Yasukazu Mase, Fujisawa; Toshihiko Katsura, Kawasaki, all of Japan

[73] Assignee: Kabushiki Kaisha Toshiba, Kawasaki, Japan

[21] Appl. No.: 416,779

[22] Filed: Oct. 4, 1989

[30] Foreign Application Priority Data

Oct. 6, 1988 [JP] Japan ................................. 63-252701

[51] Int. Cl.⁵ .......................................... H01L 21/47
[52] U.S. Cl. ................................. 437/194; 430/311; 430/316; 430/317; 148/DIG. 137; 437/229; 437/928; 437/195
[58] Field of Search ............... 437/194, 195, 229, 928; 430/311, 316, 317; 148/DIG. 137

[56] References Cited

U.S. PATENT DOCUMENTS 4,253,888  3/1981  Kikuchi ..................... 148/DIG. 137

OTHER PUBLICATIONS

Moritz, "High-Resolution Lithography with Projection Printing", *IEEE Transactions on Electron Devices*, vol. ED-26, No. 4, Apr. 1979, pp. 705–710.
S. Wolf et al., *Silicon Processing for the VLSI Ema*, Lattice Press, Sunset Beach, (1986), pp. 407–422.

*Primary Examiner*—Brian E. Hearn
*Assistant Examiner*—Laura M. Holtzman
*Attorney, Agent, or Firm*—Finnegan, Henderson, Farabow, Garrett, and Dunner

[57] ABSTRACT

A method for manufacturing semiconductor devices comprising the steps of forming a first wiring pattern including first and second lower layers on a semiconductor body, forming an insulation film which covers the first wiring pattern, forming a first hole of 1.5 μm and a second hole of 3 μm in first and second areas of the insulation film which lie over the first and second lower layers, forming a second wiring pattern having first and second upper layers respectively connected to the first and second lower layers via the first and second holes. In the method, the hole formation step includes the substeps of forming a resist film which covers the insulation film, forming a resist pattern by effecting the photolithographic process of exposing the insulation film to light by using a mask pattern having a first hole defining area of 1.5 μm and a second hole defining area of 2.4 μm, and etching the insulation film with the resist pattern used as a mask. The exposing light amount used in the resist pattern formation substep is previously determined so that the size of the first hole can be set equal to that of the first hole defining area, and the reduced amount of the second hole defining area is previously determined so that the size of the second hole obtained under the determined exposing light amount can be set to 3 μm.

7 Claims, 5 Drawing Sheets

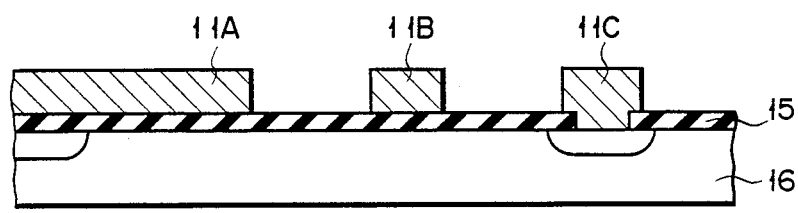
F I G. 3A
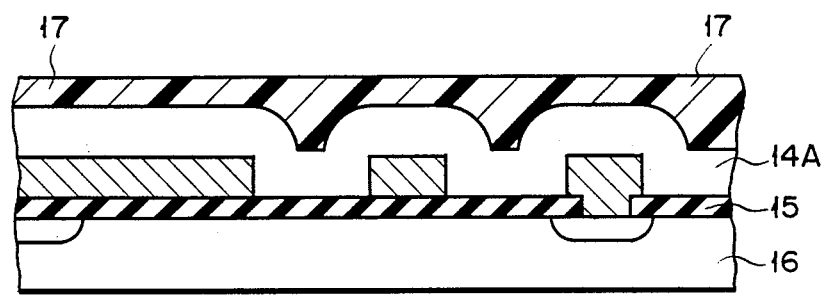
F I G. 3B
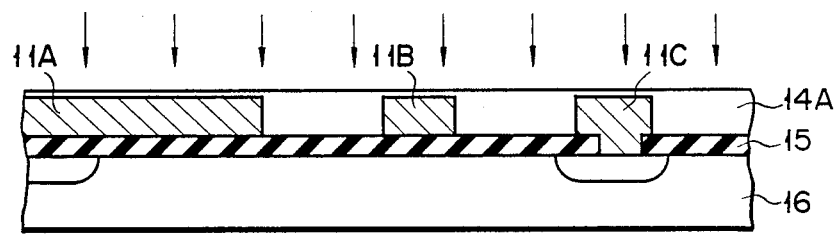
F I G. 3C

PHOTOLITHOGRAPHIC METHOD FOR MANUFACTURING SEMICONDUCTOR WIRING PATTERNS

BACKGROUND OF THE INVENTION

1. Field of the Invention

This invention relates to a method for manufacturing semiconductor devices, and more particularly to a method for manufacturing semiconductor devices having contact holes of different sizes via which the wirings thereof are made.

2. Description of the Related Art

It is known in the art that a semiconductor integrated circuit is formed to have first and second wiring patterns which are laminated over a semiconductor substrate and are isolated from each other by means of an interlayer insulation film. The first wiring pattern is constituted by a plurality of lower wiring layers and the second wiring pattern is constituted by a plurality of upper wiring layers. The upper wiring layers are connected to the lower wiring layers via a plurality of contact holes formed in the interlayer insulation film. Each contact hole is formed in an area in which one set of upper and lower wiring layers connected to each other via the contact hole overlap each other. The sizes of the contact holes may vary depending on the withstand current determined for each contact hole. However, the matching margin A between the contact hole and the lower wiring layer and the matching margin B between the contact hole and the upper wiring layer are constant. The matching margin A is determined depending on an aligning error of a mask pattern used in a process for forming the first wiring pattern, and the matching margin B is determined depending on an aligning error of mask patterns used in processes for forming the contact hole and the first wiring pattern.

The above semiconductor integrated circuit can be formed at relatively high yield when the integration density is low. However, if the width of the wiring is narrowed with an increase in the integration density and the size C of the contact hole is set, for example, to be less than 1.5 μm according to the width of the wiring, the manufacturing yield of the semiconductor integrated circuit is considerably lowered.

SUMMARY OF THE INVENTION

An object of this invention is to provide a method for manufacturing semiconductor devices in which the manufacturing yield can be prevented form being lowered even when the contact hole is made small.

The above object can be attained by a method for manufacturing semiconductor devices comprising the steps of forming a first wiring pattern including at least first and second lower conductive layers formed on a semiconductor substrate; forming an insulation film which covers the first wiring pattern; forming a first contact hole of a first size and a second contact hole of a second size larger than the first size in first and second areas of the insulation film which lie over the first and second lower conductive layers; forming a second wiring pattern having first and second upper conductive layers respectively connected to the first and second lower conductive layers via the first and second contact holes; wherein the contact hole formation step includes the sub-steps of forming a resist film which covers the insulation film; forming a resist pattern by effecting the photolithographic process of exposing the insulation film to light by using a mask pattern having a first contact hole defining area of a size substantially equal to the first size and a second contact hole defining area of a size smaller than the second size; and etching the insulation film with the resist pattern used as a mask; and the exposing light amount used in the resist pattern formation sub-step is previously determined so that the size of the first contact hole can be set equal to that of the first contact hole defining area, and the reduced amount of the second hole defining area is previously determined so that the size of the second contact hole obtained under the determined exposing light amount can be set equal to the second size.

According to the method for manufacturing semiconductor devices, the dependences of the resist pattern formation sub-step and the insulation film etching sub-step on the contact hole size can be cancelled. When the size of the first contact hole is reduced to the first size which is less than 3 μm, the first contact hole which is formed through the resist pattern formation sub-step and the insulation film etching sub-step may generally become smaller than the designed value, thereby increasing the contact resistance. In order to solve this problem, the exposing light amount used in the resist pattern formation sub-step of the method of this invention is previously determined so that the size of the first contact hole which is formed in the insulation film etching sub-step may become equal to the first size or the designed value. In this case, the exposing light amount will increase in comparison with the normal case. At this time, it may seem possible that the size of the second contact hole becomes larger than the second size and extends outwardly of an area on which the second lower conductive layer and the second upper conductive layer are overlapped. However, in this invention, the reduced amount of the second hole defining area of the mask pattern is previously determined so that the size of the second contact hole which i formed in the insulation film etching sub-step can be set equal to the second size or the designed value. In this way, if the contact holes are formed with the designed sizes, reduction in the manufacturing yield due to miniaturization of the contact hole can be prevented. Further, since the miniaturization of the contact hole will not be limited by the dependency of the resist pattern formation sub-step and the insulation film etching substep on the contact hole size, the semiconductor device can be formed with a further increased integration density.

BRIEF DESCRIPTION OF THE DRAWINGS

FIGS. 3A to 3F are cross sectional views showing the process of manufacturing the semiconductor device shown in FIGS. 1 and 2;

DETAILED DESCRIPTION OF THE PREFERRED EMBODIMENTS

There will now be described a semiconductor device according to an embodiment of this invention with reference to FIGS. 1 to 6.

Figure 1:
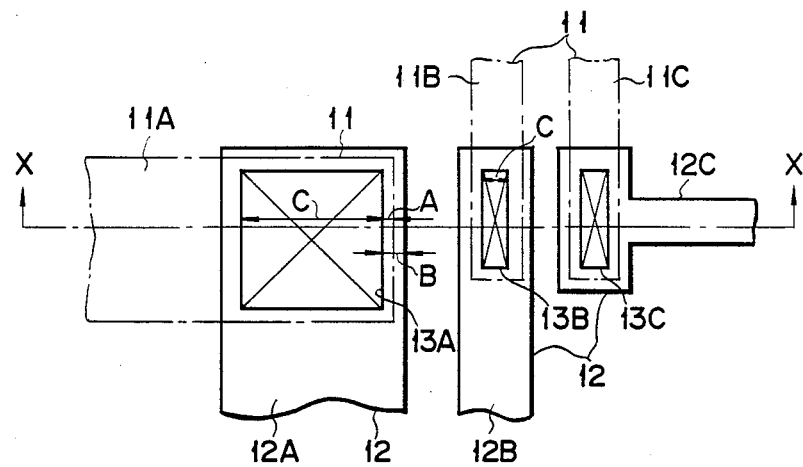
FIG. 1 is a plan view of a semiconductor device according to one embodiment of this invention.
Figure 2:
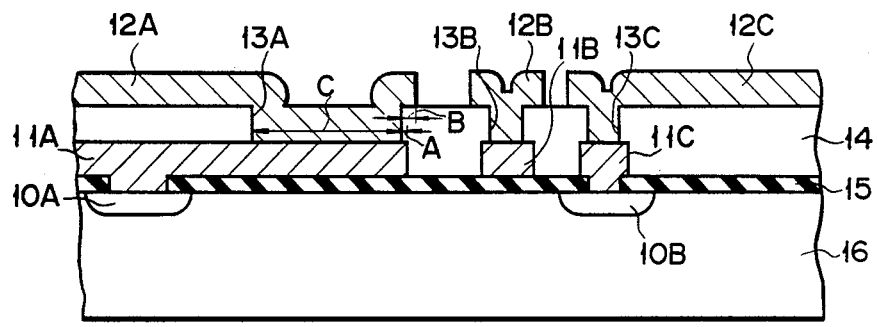
FIG. 2 is a cross sectional view of the semiconductor device taken along the line X—X of FIG. 1.

FIG. 1 is a plan view of the semiconductor device and FIG. 2 is a cross sectional view of the semiconductor device taken along the line X—X of FIG. 1. The semiconductor device is a semiconductor integrated circuit having a number of semiconductor elements formed in the surface area of a semiconductor substrate 16. Two semiconductor elements 10A and 10B among the semiconductor elements are shown in FIG. 2. Wirings for the number of semiconductor elements are made by using first and second wiring patterns 11 and 12 which are disposed over the semiconductor substrate 16. The first and second wiring patterns 11 and 12 are formed of aluminum and are isolated from each other by means of interlayer insulation film 14 disposed between the first and second wiring patterns 11 and 12. The first wiring pattern 11 includes a plurality of wiring layers, for example, wiring layers 11A, 11B, 11C, which are formed on a silicon oxide film 15 covering the surface of the semiconductor substrate 16. The wiring layers 11A and 11C are connected to the semiconductor elements 10A and 10B via openings formed in the oxide film 15, thus serving as electrodes of the semiconductor elements 10A and 10B. The second wiring pattern 12 includes a plurality of wiring layers, for example, wiring layers 12A, 12B, 12C, which are formed on a silicon oxide film 14 covering the exposed surface of the oxide film 15 and the first wiring pattern 11 and serving as an interlayer insulation film 14. The wiring layers 12A, 12B and 12C are connected to the wiring layers 11A, 11B and 11C via contact holes 13A, 13B and 13C formed in the interlayer insulation film 14. The contact holes 13A, 13B and 13C are formed so as not to exceed outwardly of the areas of the interlayer insulation film 14 which lie over the wiring layers 11A, 11B and 11C. For this purpose, the reference positions of the contact holes are set at respective positions which are set behind the peripheries of the areas of the interlayer insulation film 14 by a preset distance corresponding to the matching margin A in the same manner as in the prior art. For example, the width of the contact hole 13A is set at 3 $\mu$m and the width of the contact holes 13B and 13C is set at, for example, 1.5 $\mu$m which is less than 3 $\mu$m. In a case where the contact holes 13A, 13B and 13C are formed in a rectangular form as shown in FIG. 1, the width of the contact hole is used to represent the size of the contact hole.

Next, the manufacturing process of the semiconductor device is explained with reference to FIGS. 3A to 3F.

In the step of FIG. 3A, a number of semiconductor elements, for example, semiconductor elements 10A and 10B are formed in the surfaces area of the semiconductor substrate 16 and then the silicon oxide film 15 is formed to a thickness of 0.6 $\mu$m. The surfaces of the semiconductor substrate 16 and the semiconductor elements 10A and 10B are covered with the silicon oxide film 15. Openings are selectively formed in positions corresponding to the semiconductor elements 10A and 10B, for example, in the silicon oxide film 15 and then an aluminum layer is formed by deposition to a thickness of 1 $\mu$m on the exposed portions of the silicon oxide film 15 and the semiconductor elements 10A and 10B. The first wiring pattern 11 is formed by selectively removing the aluminum layer from the silicon layer 15 by using a mask pattern. The wiring layers 11A, 11B and 11C are formed of portions of the aluminum layer left behind on the silicon oxide film 15.

In the step of FIG. 3B, a silicon oxide film 14A of a thickness of 1.1 $\mu$m is formed to cover the exposed portion of the first wiring pattern 11 and the silicon oxide film 15 by the plasma CVD method. The upper surface of the silicon oxide film 14A has convex and concave portions corresponding to the exposed portions of the first wiring pattern 11 and the silicon oxide film 15. A photoresist 17 is formed by coating on the silicon oxide film 14A so as to fill up the concave portions of the upper surface. The thickness of that portion of the photoresist 17 which lies on a portion other than the concave portion is set to 0.8 $\mu$m.

In the step of FIG. 3C, the photoresist 17 is etched back by the thickness of 1.8 $\mu$m together with the convex portions of the silicon oxide film 14A. As a result, the upper surface of the silicon oxide film 14A is made flat.

Figure 3D:
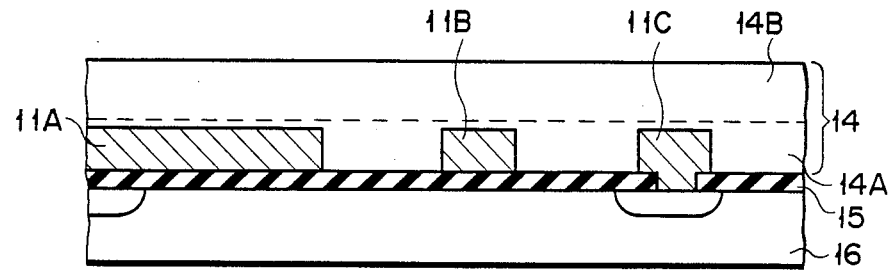

In the step of FIG. 3D, a silicon oxide film 14B is formed by deposition to a thickness of 1.4 $\mu$m on the silicon oxide film 14A by the plasma CVD method. The interlayer insulation film 14 is formed of the silicon oxide films 14A and 14B.

Figure 3E:
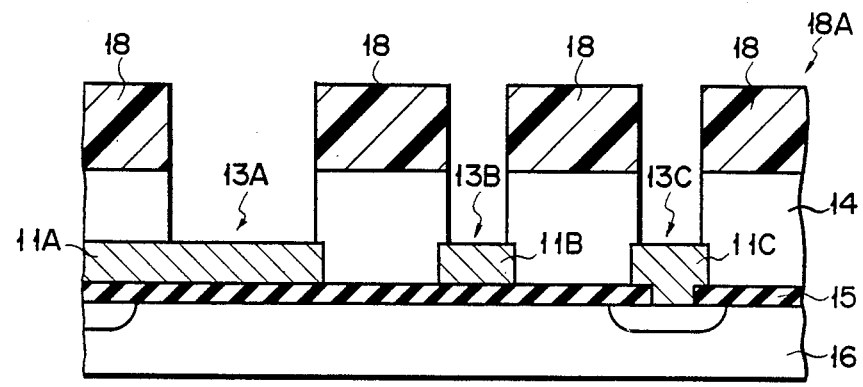

In the step of FIG. 3E, a positive photoresist film 18 is uniformly formed by coating to a thickness of 1.5 $\mu$m on the upper surface of the interlayer oxide film 14 and is then subjected to a photolithographic process. In the photolithographic process, a stepper is used to divide the plane of the photoresist film 18 into a plurality of areas and permit the areas to be sequentially exposed. In exposing each of the areas, a mask pattern as will be described later is used and the exposing light amount is set to an adequate value described later. After the completion of the exposing process for all the areas, the exposed portion of the photoresist film 18 is removed and the remaining portion of the photoresist film 18 is used to constitute a resist pattern 18A. After this, a reactive ion etching (RIE) process is effected with the resist pattern 18A used as a mask so as to selectively remove portion of the interlayer insulation film 14 from the first wiring pattern 11. As a result, the contact holes 13A, 13B and 13C are formed. Then, the resist pattern 18A is removed.

Figure 3F:
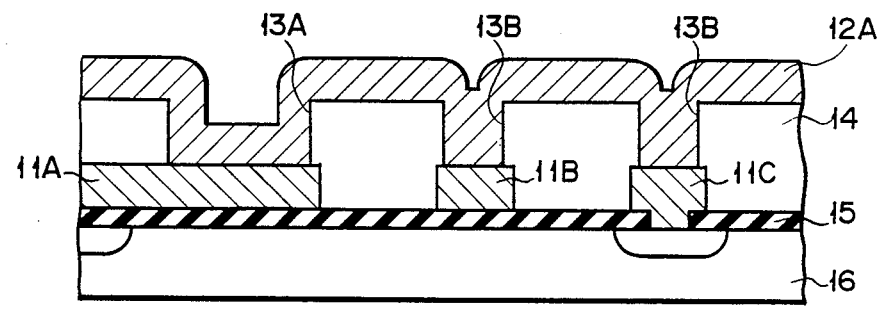
Figure 4:
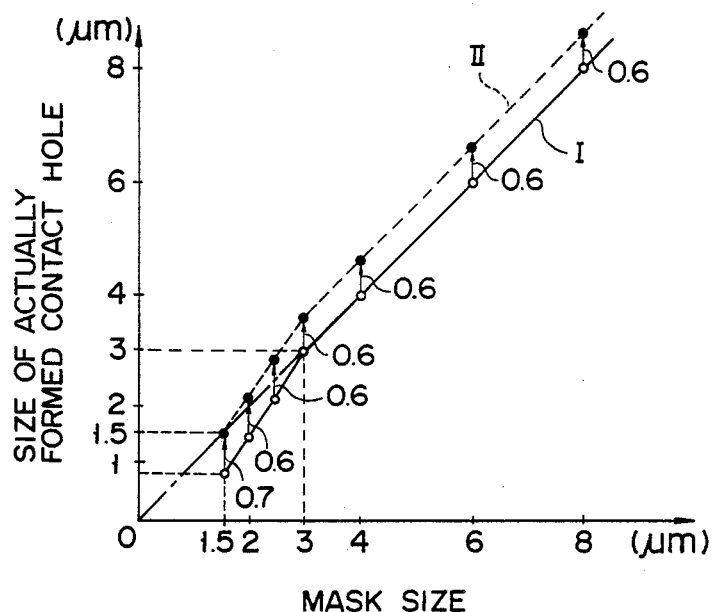
FIG. 4 is a graph showing the relation between the size of a contact hole and the size of the contact hole defining area of a mask pattern obtained in a case where exposing light amount used in the step of FIG. 3E is changed.

In the step of FIG. 3F, an aluminum layer 12A is formed by deposition to a thickness of 1.0 $\mu$m on the exposed portion of the interlayer insulation film 14 and the first wiring pattern 11. The aluminum layer 12A is selectively removed from the interlayer insulation film 14 by using a mask pattern and the second wiring pattern 12 shown in FIG. 2 is formed of the remaining portion of the aluminum layer 12A.

Now, the photolithographic process effected in the step of FIG. 3E is explained in more detail. In a case where the contact hole is formed in the interlayer insulation film 14, the contact hole defining area having the same size as the designed size of the contact hole is set in the mask pattern in the prior art. When the photoresist film 18 is exposed by using the mask pattern, the exposing light amount is so determined that the size or width of the actually formed contact hole can be set to be equal to that of the contact hole defining area. For example, if the exposing light amount is determined so as to form a contact hole of 3 μm in the interlayer insulation film 14, this exposing light amount can be used for formation of a contact hole having a width of larger than 3 μm, for example, 4, 6 or 8 μm as shown by the line I in FIG. 4. However, it is confirmed from experiments that if the previously determined exposing light amount is used for formation of a contact hole having a width of less than 3 μm, for example, 2 μm, the width of an actually formed contact hole is set to 1.6 μm. Further, if the contact hole is designed to have a width of 1.5 μm, the width of an actually formed contact hole is set to 0.8 μm. In this case, the contact resistance between the two wiring layers connected to each other via the contact hole becomes extremely high. When the exposing light amount is increased so as to set the width of the contact hole with 1.5 μm width to a designed value based on the above experiments, the width of an actually formed contact hole with more than 3 μm width is set to be larger than the designed value by 0.6 μm as shown by the line 11 of FIG. 4.

With the mask pattern of this embodiment, the size of the defined area for the contact hole 13A is set to 2.4 μm which is smaller than the designed value by 0.6 μm and the size of the defined areas for the contact holes 13B and 13C is set to 1.5 μm which is equal to the designed value. In this case, the exposing light amount is set to be twice the stand and exposing light amount at which contact holes of not less than 3 μm width can be actually formed with the designed widths.

Figure 5:
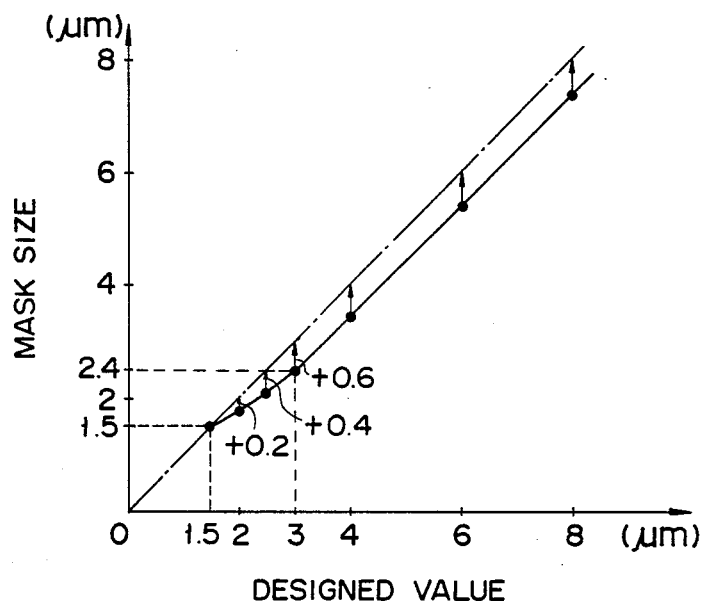
FIG. 5 is a graph showing the size of the contact hole defining area of a mask pattern which is determined by the designed size of a contact hole.
Figure 6:
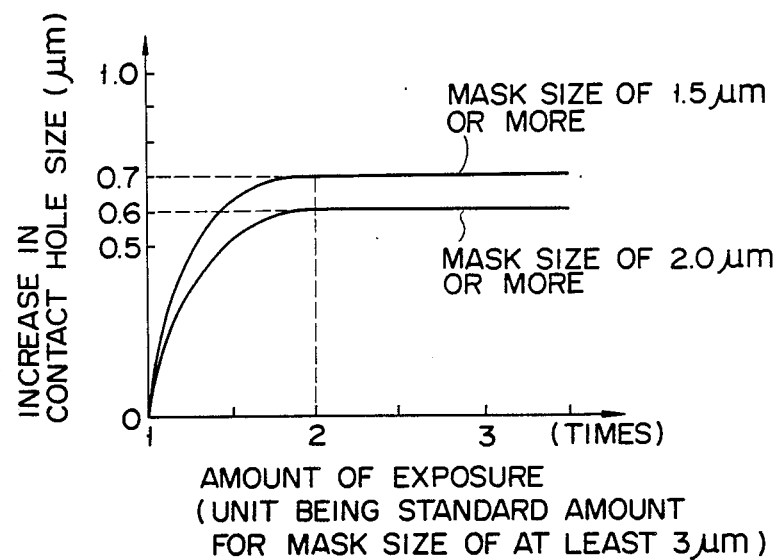
FIG. 6 is a graph showing the relation between the increase in the exposing light amount and the increase in the contact hole size.

FIG. 5 shows the size of the contact hole defining area of a mask pattern which is determined by the designed size of a contact hole, and FIG. 6 shows the relation between the increase in the exposing light amount and the increase in the contact hole size.

According to this embodiment, contact holes of 1.5 and 3 μm widths can be formed with the designed values by changing the size of the mask pattern and at the same time effecting an excessive light exposing step in the photolithographic process. In the process of exposing the photoresist 18A, if the exposing light amount is simply increased, then a contact hole of not larger than 1.5 μm width may be formed with the designed value, but a contact hole of not less than 1.5 μm width cannot be formed with the designed value and will be formed with a width larger than the designed value by 0.6 μm, which is set smaller than 0.7 μm due to the saturation shown in FIG. 6. In order to correct the above error, the size of the contact hole defining area of a mask pattern used for formation of a contact hole with not less than 3 μm width is reduced by 0.6 μm in comparison with the designed value.

With this correction, the error for formation of contact holes of all sizes can be suppressed within 0.2 μm. As a result, it becomes unnecessary to uselessly widen the matching margin of the mask pattern.

Semiconductor integrated circuits having contact holes of various sizes ranging from 2 to 20 μm are manufactured as experiments according to the method of this embodiment. Generally, the mask aligning error of 0.3 μm and the etching error of 0.2 μm occur in the formation of these contact holes. In a case where the matching margin A between the first wiring pattern and each contact hole was set 0.7 μm, the contact hole may not extend outwardly of the first wiring pattern. Since the matching margin A is used for the mask aligning error of 0.3 μm and the etching error of 0.2 μm, 0.2 μm is left unused in the matching margin A when the contact hole is formed with a designed size. Therefore, it was proved that a sufficiently high reliability could be obtained in the manufacturing process.

Unlike this embodiment, if the exposing light amount is increased without correcting the size of the mask pattern for formation of contact holes of not less than 3 μm, the size of the contact hole will increased 0.6 μm. In this case, the size of the contact hole increases by 0.3 μm on one side thereof. Taking the mask aligning error of 0.3 μm and the etching error of 0.2 μm into consideration, there is a possibility that the contact hole may extend outwardly of the first wiring pattern when the matching margin A is set to 0.7 μm. In order to prevent this, it becomes necessary to set the matching margin A to at least 0.8 μm. Further, in order to attain the reliability of the same level as that obtained in the above embodiment, it will be necessary to set the matching margin A to 1.0 μm. Assume that the semiconductor device is manufactured under a condition that the matching margin A is set to 1.0 μm and it includes 9,000 semiconductor elements. Then, the integration density of the semiconductor device manufactured according to the method of the above embodiment may be approx. 1.3 times that of the semiconductor device with the matching margin A of 1.0 μm.

In the step of FIG. 3E, the exposing light amount is increased so that the contact holes 13B and 13C can be formed with designed sizes. Instead, it can be considered that the contact hole defining areas for the contact holes 13B and 13C are enlarged to prevent the contact holes 13B and 13C from being made smaller than the designed sizes. However, this method cannot reliably prevent the manufacturing yield from being lowered since the size of each of the contact holes 13B and 13C is remarkably changed if the size of the corresponding contact hole defining area is slightly changed due to a variation in the mask pattern formation process.

Figure 7:
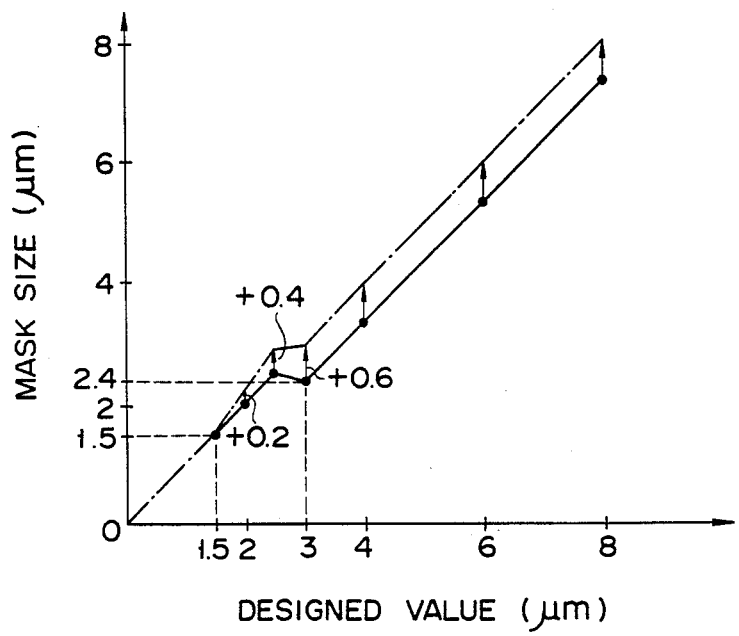
FIG. 7 is a graph showing the size of the control hole defining area which is determined by the designed size of a contact hole according to another embodiment.

In the embodiment described above, the contact holes of 1.5 and 3 μm are provided to the semiconductor device. In a case where a contact hole of a size larger than 1.5 μm and smaller than 3 μm is further provided to the semiconductor device, the size of the contact hole defining area of a mask pattern is set smaller than the designed size of this contact hole to prevent this contact hole from being made larger than the designed size, as is shown in FIG. 5. Instead, it is possible to set the size of the contact hole defining area equal to the designed size of this contact hole if the matching margin remains, as is shown in FIG. 7.

Further, a contact hole smaller than 1.5 μm can be provided to the semiconductor device. In this case, the exposing light amount used in the step 3E is determined so that this contact hole is actually formed with the designed value. Generally, the exposing light amount is determined according to the size of the smallest one of the contact holes provided in the semiconductor device.

What is claimed is:
1. A method for manufacturing semiconductor devices comprising the steps of:
 forming a first wiring pattern including at least first and second lower conductive layers formed on a semiconductor body;
 forming an insulation film which covers said first wiring pattern;

forming a first contact hole of a first size and a second contact hole of a second size larger than the first size in first and second areas of said insulation film which lie over said first and second lower conductive layers; and forming a second wiring pattern having first and second upper conductive layers respectively connected to said first and second lower conductive layers via said first and second contact holes;

wherein said contact hole formation step includes the sub-steps of forming a resist film which covers said insulation film; forming a resist pattern by effecting the photolithographic process of exposing said insulation film to light by using a mask pattern having a first contact hole defining area of a size substantially equal to the first size and a second contact hole defining area of a size smaller than the second size; and etching said insulation film with said resist pattern used as a mask; and the exposing light amount used in said resist pattern formation sub-step is previously determined so that the size of the first contact hole can be set equal to that of the first contact hole defining area, and the reduced amount of the second contact hole defining area is previously determined so that the size of the second contact hole obtained under the determined exposing light amount can be set equal to the second size.

2. A method according to claim 1, wherein said first size is less than 3 $\mu$m.

3. A method according to claim 2, wherein said reduced amount of said second contact hole defining area is approximately 0.6 $\mu$m when said second size is not less than 3 $\mu$m.

4. A method according to claim 3, wherein the matching margin between said first contact hole and said first lower conductive layer and the matching margin between said second contact hole and said second lower conductive layer are set to 0.7 $\mu$m.

5. A method according to claim 1, wherein said semiconductor body includes a semiconductor substrate and an insulating film formed on said semiconductor substrate.

6. A method according to claim 5, wherein said semiconductor body further includes a plurality of semiconductor elements formed in the surface of said semiconductor substrate, an either said first or second lower conductive layer is connected to one of said semiconductor elements through an opening formed in said insulating layer and serving as an electrode for said semiconductor element.

7. A method according to claim 6, wherein said first wiring pattern is formed of aluminum.

* * * * *

UNITED STATES PATENT AND TRADEMARK OFFICE
CERTIFICATE OF CORRECTION

PATENT NO. : 4,952,528

DATED : August 28, 1990

INVENTOR(S) : Masahiro Abe et al.

It is certified that error appears in the above-identified patent and that said Letters Patent is hereby corrected as shown below:

column 8, line 21, change "an" to --and--.

Signed and Sealed this

Sixth Day of April, 1993

Attest:

STEPHEN G. KUNIN

Attesting Officer

Acting Commissioner of Patents and Trademarks